(12) United States Patent
Hu et al.

(10) Patent No.: US 10,804,897 B2
(45) Date of Patent: Oct. 13, 2020

(54) TOUCH-SENSITIVE KEYPAD CONTROL DEVICE

(71) Applicant: Touchplus Information Corp., New Taipei (TW)

(72) Inventors: Shih-Hsien Hu, New Taipei (TW); Yi-Feng Wei, New Taipei (TW); Yao-Chih Chuang, Tainan (TW)

(73) Assignee: TOUCHPLUS INFORMATION CORP., New Taipei (TW)

( * ) Notice: Subject to any disclaimer, the term of this patent is extended or adjusted under 35 U.S.C. 154(b) by 47 days.

(21) Appl. No.: 14/594,273

(22) Filed: Jan. 12, 2015

(65) Prior Publication Data
US 2015/0199023 A1     Jul. 16, 2015

(30) Foreign Application Priority Data

Jan. 10, 2014  (TW) ............................. 103200576 U
Jan. 29, 2014  (TW) ............................. 103103512 A
May 8, 2014    (CN) .......................... 2014 1 0192491

(51) Int. Cl.
G06F 3/02     (2006.01)
G06F 3/0488   (2013.01)
H03K 17/96    (2006.01)

(52) U.S. Cl.
CPC ......... H03K 17/962 (2013.01); G06F 3/0213 (2013.01); G06F 3/04883 (2013.01); H03K 2217/96054 (2013.01)

(58) Field of Classification Search
CPC ........ H03K 2217/96054; H03K 17/962; G06F 3/033; G06F 3/041; G06F 2203/04111
See application file for complete search history.

(56) References Cited

U.S. PATENT DOCUMENTS

| | | | | |
|---|---|---|---|---|
| 5,270,710 A | * | 12/1993 | Gaultier | H03K 17/967 200/600 |
| 5,598,527 A | * | 1/1997 | Debrus | G06F 3/044 341/22 |
| 7,808,486 B2 | * | 10/2010 | Griffin | G06F 1/1626 345/168 |

(Continued)

FOREIGN PATENT DOCUMENTS

| | | |
|---|---|---|
| CN | 102750032 | 10/2012 |
| CN | 103226418 | 7/2013 |
| TW | 201415334 | 4/2014 |

OTHER PUBLICATIONS

Office action from the CNIPA dated Apr. 24, 2019.

*Primary Examiner* — William Boddie
*Assistant Examiner* — Bipin Gyawali
(74) *Attorney, Agent, or Firm* — WPAT, PC

(57) ABSTRACT

A touch-sensitive keypad control device for use with a controlled device is provided. The touch-sensitive keypad control device includes: a housing, a touch control device disposed in the housing, and a keypad device uncovered from the housing and disposed above the touch control device. The touch control device generates a first command for controlling the controlled device in response to a gesture of a user relative to the keypad device, and the keypad device generates a second command for controlling the controlled device in response to a level change of the keypad device relative to the housing in response to a pressing operation of a user.

8 Claims, 15 Drawing Sheets

(56) References Cited

U.S. PATENT DOCUMENTS

| | | | | |
|---|---|---|---|---|
| 8,450,627 B2* | 5/2013 | Mittleman | | H03K 17/962 200/406 |
| 9,958,972 B2* | 5/2018 | Chi | | G06F 3/041 |
| 2002/0137550 A1* | 9/2002 | Graham | | G06F 3/0233 455/566 |
| 2007/0115263 A1* | 5/2007 | Taylor | | G06F 3/03547 345/169 |
| 2007/0151838 A1* | 7/2007 | Lundell | | H01H 13/7006 200/512 |
| 2007/0284154 A1* | 12/2007 | Li | | G06F 3/046 178/18.03 |
| 2008/0042978 A1* | 2/2008 | Perez-Noguera | | G06F 3/023 345/168 |
| 2008/0062140 A1* | 3/2008 | Hotelling | | G06F 3/0412 345/173 |
| 2009/0008234 A1* | 1/2009 | Tolbert | | H01H 13/702 200/600 |
| 2009/0135144 A1* | 5/2009 | Chuang | | G06F 3/0202 345/168 |
| 2009/0179865 A1* | 7/2009 | Kumar | | G06F 1/1643 345/173 |
| 2009/0231019 A1* | 9/2009 | Yeh | | G06F 3/041 327/509 |
| 2009/0262096 A1* | 10/2009 | Teramoto | | G06F 3/041 345/174 |
| 2010/0148999 A1* | 6/2010 | Casparian | | H03K 17/975 341/34 |
| 2010/0214234 A1* | 8/2010 | Singhal | | G06F 3/04883 345/173 |
| 2010/0321301 A1* | 12/2010 | Casparian | | G06F 3/016 345/168 |
| 2011/0095877 A1* | 4/2011 | Casparian | | H03K 17/975 340/407.2 |
| 2011/0102326 A1* | 5/2011 | Casparian | | G06F 3/016 345/168 |
| 2012/0050167 A1* | 3/2012 | Krahenbuhl | | G06F 3/0227 345/169 |
| 2012/0075486 A1* | 3/2012 | Lee | | H03K 17/962 348/207.99 |
| 2012/0092270 A1* | 4/2012 | Lyon | | G06F 3/03547 345/173 |
| 2012/0169640 A1* | 7/2012 | Lin | | G06F 3/04886 345/173 |
| 2012/0228109 A1* | 9/2012 | Wang | | H01G 5/16 200/600 |
| 2012/0274604 A1* | 11/2012 | Norton | | H03K 17/962 345/174 |
| 2013/0154938 A1* | 6/2013 | Arthur | | G06F 3/0416 345/168 |
| 2013/0161179 A1* | 6/2013 | Tamura | | G06F 3/0414 200/600 |
| 2013/0285980 A1* | 10/2013 | Oya | | G06F 3/044 345/174 |
| 2014/0022467 A1* | 1/2014 | Chai | | G02F 1/13338 349/12 |
| 2014/0035865 A1 | 2/2014 | Hu | | |
| 2014/0097885 A1 | 4/2014 | Hu | | |
| 2014/0118635 A1* | 5/2014 | Yang | | G06F 1/1692 349/12 |
| 2014/0125882 A1* | 5/2014 | Jiang | | G06F 3/044 349/12 |
| 2014/0145979 A1* | 5/2014 | Lee | | H01L 51/5256 345/173 |
| 2014/0253454 A1* | 9/2014 | Caldwell | | G06F 3/0488 345/168 |
| 2014/0266814 A1* | 9/2014 | Hu | | H03K 17/962 341/26 |
| 2014/0313435 A1* | 10/2014 | Cho | | G06F 3/044 349/12 |
| 2015/0002487 A1* | 1/2015 | Miles | | H03K 17/969 345/184 |
| 2015/0016070 A1* | 1/2015 | Chang | | H01L 51/441 361/748 |
| 2015/0027870 A1* | 1/2015 | Yang | | G06F 3/041 200/5 R |
| 2015/0062457 A1* | 3/2015 | Kida | | G06F 3/0412 349/12 |
| 2015/0070278 A1* | 3/2015 | Rehn | | G06F 3/03547 345/163 |
| 2015/0085205 A1* | 3/2015 | Chen | | G06F 3/044 349/12 |
| 2015/0090579 A1* | 4/2015 | Kurikawa | | H03K 17/955 200/600 |
| 2015/0169107 A1* | 6/2015 | Misaki | | G06F 3/044 345/174 |
| 2015/0363026 A1* | 12/2015 | Hu | | G06F 3/038 340/12.55 |

\* cited by examiner

TOUCH-SENSITIVE KEYPAD CONTROL DEVICE

FIELD OF THE INVENTION

The present invention relates to a keypad control device, and more particularly to a touch-sensitive keypad control device.

BACKGROUND OF THE INVENTION

With the advancement of digital TVs, a variety of user interfaces could be operated on a TV. Therefore, it is desirable that a control device of the TV satisfies all the requirements associated with the various user interfaces. So far, a keypad control device with pushing keys has almost been the only commercially available choice. Unfortunately, a keypad control device is not an easy tool for operating a window-type user interface.

SUMMARY OF THE INVENTION

Therefore, an object of the present invention is to provide a keypad control device which exhibits multiple input capabilities so as to be applicable to diverse user interfaces.

In an aspect of the present invention, a touch-sensitive keypad control device is for use with a controlled device, and comprises: a housing; a touch control device having a touch-sensitive surface uncovered from the housing, wherein the touch control device generates a first command for controlling the controlled device in response to a first gesture of a user relative to the touch-sensitive surface; and a keypad device integrated with the touch control device and movable relative to the touch-sensitive surface, wherein the keypad device generates a second command for controlling the controlled device in response to the movement of the keypad device enabled by a user. The touch control device further generates a third command for controlling the controlled device in response to a second gesture of a user relative to the keypad device.

In an embodiment, the touch-sensitive keypad control device according to claim 1, being a remote controller, wherein the keypad device includes a plurality of push buttons each independently movable to trigger the generation of the second command in response to a pressing operation of a user.

In an embodiment, the keypad device is disposed on a specified range of the touch-sensitive surface, the first gesture is a sliding operation outside the specified range, and the second gesture is a sliding operation in the specified range. In another embodiment, the first gesture is a vertical movement within a specified range or a holding-still action for a specified duration above the keypad device, and the second gesture is a sliding operation on or over the keypad device.

The present invention further provides a touch-sensitive keypad control device for use with a controlled device, which includes: a housing; a touch control device disposed in the housing; and a keypad device uncovered from the housing and disposed above the touch control device. The touch control device generates a first command for controlling the controlled device in response to a gesture of a user relative to the keypad device, and the keypad device generates a second command for controlling the controlled device in response to a level change of the keypad device relative to the housing in response to a pressing operation of a user.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
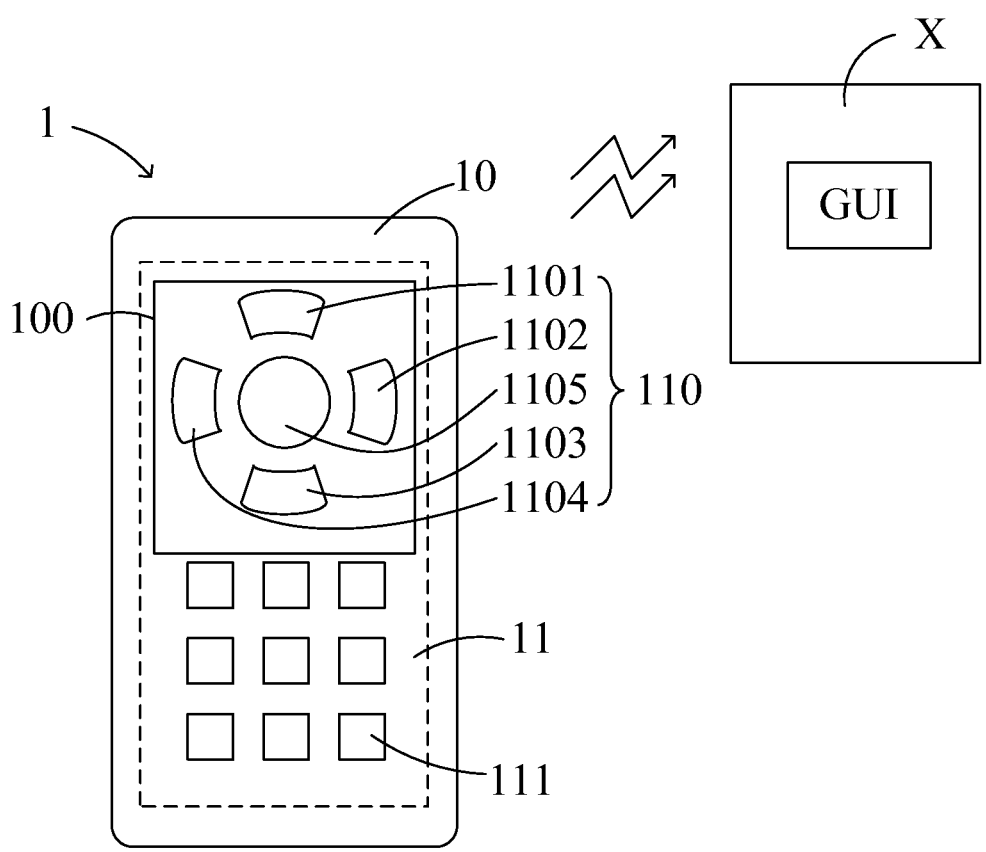
FIG. 1 is a schematic top view showing the appearance of a touch-sensitive keypad control device according to an embodiment of the present invention.

Please refer to FIG. 1, which is a schematic top view showing the appearance of a touch-sensitive keypad control device according to an embodiment of the present invention. A touch-sensitive keypad control device 1 according to the present invention is used for controlling a controlled device X, and is a kind of control device which has integrated touch control and keypad control functions. The touch-sensitive keypad control device 1, for example, may have an outer appearance of a corded or cordless remote controller, as shown in FIG. 1. Of course, it may also have any other suitable outer appearance for different kinds of applications. For example, it may be like a computer keyboard, a mouse device whose keypad is not labelled, or an ATM keypad which is not portable. The controlled device X, for example, may be an image-playing system such as TV, computer, disc player, set top box or touch-sensitive smart display. The controlled device can be any other suitable device controllable by way of keypad control and touch control. The controlled device X, when being an image-playing system, is capable of showing a graphics user interface GUI, through which a user may input information or instruction to the controlled device. The touch-sensitive keypad control device 1 according to the present invention is provided for a user to easily and readily input the information or instruction for operating the graphics user interface GUI.

It is to be noted that the term "touch-sensitive" means not only to be sensitive to a sliding or touching gesture actually acting on a specified surface but also sensitive to an air gesture floatingly acting over the specified surface. The air gesture may be a vertically moving action and/or a horizontally moving action within a specified range, or a holding-still action for a specified period of time. The horizontally moving action, for example, moves a cursor on the controlled device; the vertically moving action (movement in Z-axis), for example, simulates a pressing operation on a virtual key; and the holding-still action, for example, wakes the touch-sensitive keypad control device up from a suspension or sleep state. Hereinafter, fingers are exemplified as the tool for executing the gestures. However, any other suitable tool capable of conducting a capacitance change may be used depending on practical requirements and size of the touch-sensitive keypad control device. For example, palms or conductive objects may also be used instead. For large-area touch sensing, a plurality of touch sensing units may be combined to detect a capacitance change so as to effectively enhance the sensitivity and effective sensible distance. For example, a combination of seven touch sensing units would have a larger sensible distance than a combination of three touch sensing units. The details of other grouping effects may refer to a co-pending US Patent Application Publication No. 2014/0035865 A1.

In a concrete example, when a user performs a vertically moving action with a finger or a palm toward the touch sensing unit(s) to a certain extent, a pressing operation is determined. While the touch sensing operations in X-, Y- and Z-axes are scanned, the contour of an icon image included in the graphics user interface GUI changes with the advancement of the pressing operation. For example, the icon image gradually deflects or deforms with the finger or palm approaching the touch sensing unit(s), and is finally broken after a preset distance between the finger or palm and the touch sensing unit(s) is reached. The animation effect triggers the execution of the function indicated by the icon image.

As mentioned above, the touch-sensitive keypad control device 1 includes a touch control device and a keypad device integrated with the touch control device. The touch-sensitive keypad control device 1 has a housing 10 for accommodating therein the electronic circuit and associated elements (not shown) of the touch control device and the keypad device. The touch control device includes a touch sensing unit (not shown, to be described later) disposed in the housing and a touch sensing surface 100 disposed on or over the touch sensing unit and uncovered from the housing 10. By way of a proper design, a surface of the housing 10 may serve as the touch sensing surface 100. Alternatively, a touch sensing surface independent from the housing may also be provided, which will be exemplified later. The keypad device 11 includes a plurality of push button 110 and 111 disposed on and protruding from a top surface of the housing 10. In response to a pressing operation on one or more of the push buttons toward the housing surface by a user, the keypad device 11 generates a command associated with the pressed button or buttons for controlling the controlled device. For example, as shown in FIG. 1, the keypad device 11 includes a five-directional key set 110 consisting of push buttons 1101, 1102, 1103, 1104 and 1105, for example indicating upward, rightward, downward, leftward and enter, respectively, for adjusting magnitudes of parameters, and a plurality of push buttons 111 for data input. It is understood that other types of keypad devices which are activated by specific ways instead of pressing operations may also be used in the touch-sensitive keypad device according to the present invention. Basically, as long as an effective movement of one or more of the keypad elements, which would result in a detectable change, the keypad device 11 generates the command associated with the moved keypad element or elements for controlling the controlled device.

The touch sensing surface 100, as mentioned above, may be independent from the surface of the housing 10. For example, a surface of the keypad device 11, e.g. a surface constituted by the cover surfaces of the five-directional push buttons 110, may serve as the touch sensing surface. In other words, a user may conduct a sliding or touching gesture actually acting on the cover surfaces of the buttons as well as an air gesture floatingly acting over the cover surfaces of the buttons. Accordingly, the controlled device can be controlled in a manner corresponding to the gesture. For example, a cursor shown on a screen may be moved to work on the graphics user interface.

In a further embodiment, both a surface of the keypad device area and a surface of the housing 10 outside the keypad device area can be used as the touch sensing surface in a single touch-sensitive keypad control device. Therefore, a command for controlling the controlled device is generated by the touch control device in response to a gesture of a user relative to the touch-sensitive surface outside the keypad device area, and another command for controlling the controlled device is generated by the touch control device in response to another gesture of a user relative to the touch-sensitive surface in the keypad device area. The surface of the housing outside the keypad device area for touch sensing may be the same surface where the keypad device is disposed. Alternatively, it may be the surface of the housing opposite to the surface where the keypad device is disposed. For conducting touch sensing relative to the bottom surface, the sensing electrodes should be disposed near the bottom surface or additional sensing electrodes are provided near the bottom surface so that the gestures can be successfully detected. An index finger, for example, may do the touch sensing on or under the bottom surface of the housing. Meanwhile, the keypad device elements are still disposed on the top surface of the housing.

Figure 2:
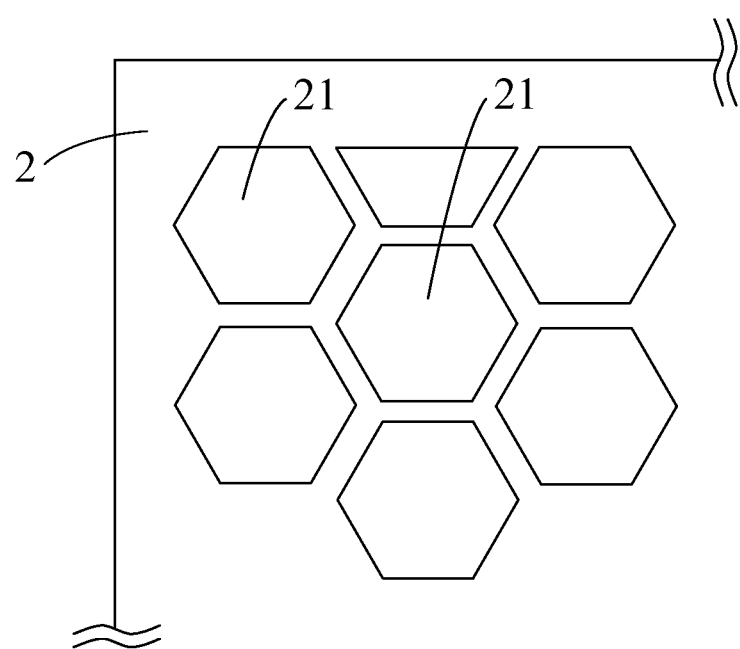
FIG. 2 is a schematic top view illustrating the arrangement of sensing electrodes included in a touch-sensitive keypad control device according to an embodiment of the present invention.

Please refer to FIG. 2, in which an exemplified layout of the touch sensing unit is schematically illustrated. The touch sensing unit is a one-dimensional touch sensing unit formed on a substrate 2 and includes a plurality of hexagonal sensing electrodes 21 separate from one another. The sensing electrodes 21 detect the capacitance changes according to the gesture or gesture change of the touching or approaching finger(s), and outputting the detected result to a sensing circuit (not shown) via respective signal lines (not shown here but later). The sensing circuit is then able to estimate the touch control point(s) or the movement of the touch control points accordingly. The touch sensing methods and devices and associated techniques may refer to the disclosure of co-pending US Patent Application Publication No. 2014/0097885 A1 as well as the disclosure of its counterpart Taiwanese Patent Application Publication No. 201415334.

Figure 3A:
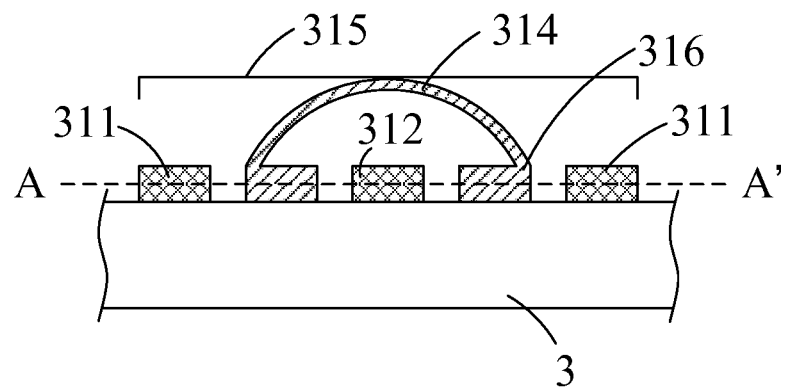
FIG. 3A is a schematic vertically cross-sectional view illustrating a first exemplified structure of a sensing electrode according to the present invention.
Figure 3B:
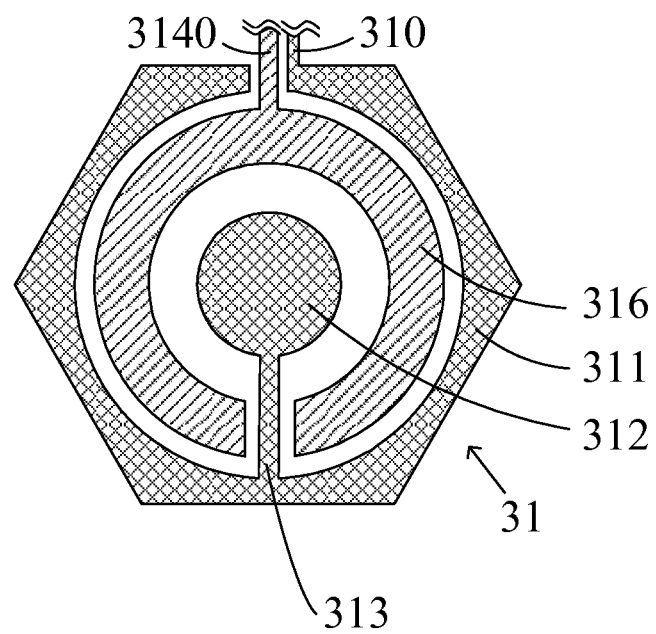
FIG. 3B is a schematic horizontally cross-sectional view of the first exemplified structure of the sensing electrode, taken along the A-A' of FIG. 3A.

FIGS. 3A and 3B illustrate a first exemplified structure of a sensing electrode according to the present invention, wherein FIG. 3A is a schematic vertically cross-sectional view, and FIG. 3B is a schematic horizontally cross-sectional view taken along the A-A' of FIG. 3A. In this embodiment, the sensing electrode 31 includes an outer ring member 311, a central member 312, and a bridge member 313 formed on a substrate 3, and the bridge member 313 is the only connection between the outer ring member 311 and the central member 312. The sensing electrode 31 is in communication with a sensing circuit (not shown) via a signal line 310. In this embodiment, respective signal lines are used for signal transmission for separate sensing electrodes. The sensing electrode 31 detects the capacitance changes according to the gesture or gesture change of the touching or approaching finger(s), and the sensing circuit estimates the touch control point(s) or the movement of the touch control points accordingly.

Figure 4:
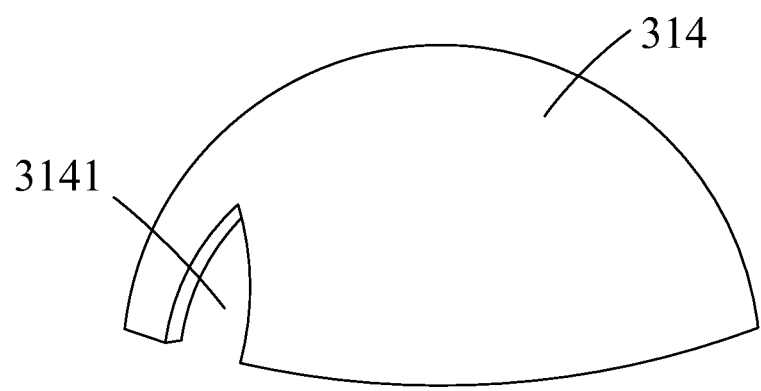
FIG. 4 is a schematic perspective view illustrating an example of the flexible dome structure shown in FIG. 3A.

As shown in FIG. 3A, the keypad device further includes a flexible dome structure 314 under the cover 315 of each of the push buttons. The base 316 of the flexible dome structure 314 is fixed onto the substrate 3 where the sensing electrode 31 is formed while separating from the sensing electrode 31. The flexible dome structure 314 is made of a conductive material and deformable so as to be movable toward the central member 312 in response to a pressing operation of a user on the cover 315. An exemplified structure of the conductive dome structure 314 is schematically shown in FIG. 4, wherein the slit 3141 is created corresponding to the position of the bridge member 313, thereby allowing the signal line 310, the outer ring member 311, the central member 312, the bridge member 313, the base 316 of the conductive dome structure 314 and the grounding line 3140 to be simultaneously formed by etching a single conductive layer formed on a surface of the substrate 3. It is thus cost and laboring effective. Once the conductive dome structure 314 is pressed to move toward the central member 312 to have a capacitance therebetween increased to a certain extent, a capacitance change between the grounding line 3140 and the signal line 310 would be detected so that the input or command associated with the push button would be entered.

Figure 5A:
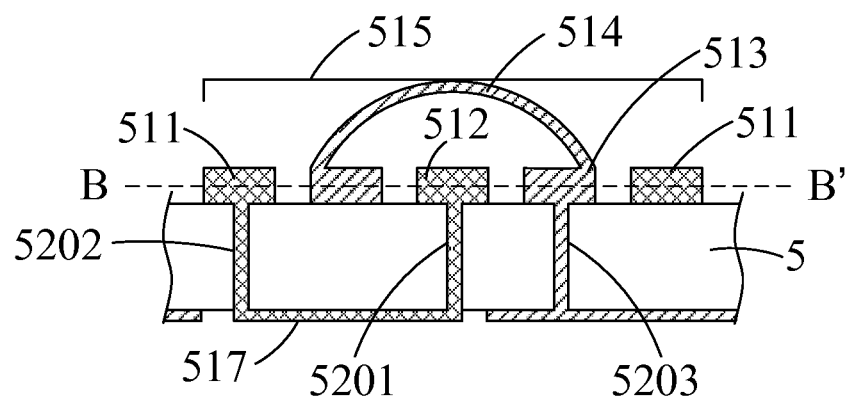
FIG. 5A is a schematic vertically cross-sectional view illustrating a second exemplified structure of a sensing electrode according to the present invention.
Figure 5B:
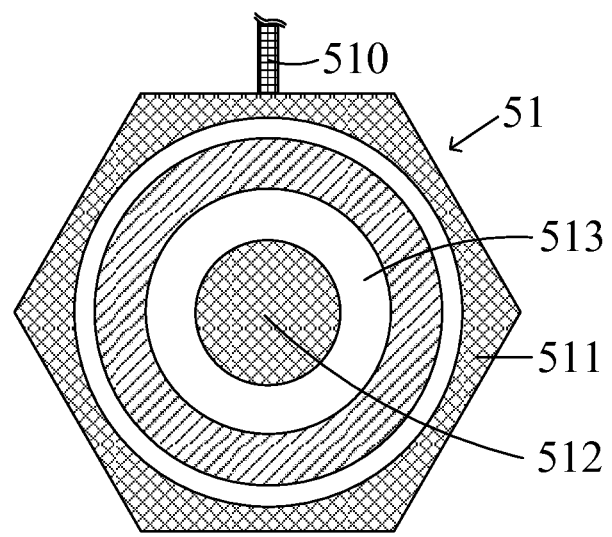
FIG. 5B is a schematic horizontally cross-sectional view of the second exemplified structure of the sensing electrode, taken along the B-B' of FIG. 5A.

FIGS. 5A and 5B illustrate a second exemplified structure of a sensing electrode according to the present invention, wherein FIG. 5A is a schematic vertically cross-sectional view, and FIG. 5B is a schematic horizontally cross-sectional view taken along the B-B' of FIG. 5A. The sensing electrode 51 in this embodiment is similar to that shown in FIGS. 3A and 3B, which includes an outer ring member 511 and a central member 512 formed on a substrate 5, but there is no bridge member between the outer ring member 511 and the central member 512. Instead, the outer ring member 511 and the central member 512 extend to the opposite side of the substrate 5 via respective through holes 5202 and 5201, and are connected to each other as a bridge member 517 on the opposite surface of the substrate 5. The sensing electrode 51 is in communication with a sensing circuit (not shown) via a signal line 510. The sensing electrode 51 detects the capacitance changes according to the gesture or gesture change of the touching or approaching finger(s), and the sensing circuit estimates the touch control point(s) or the movement of the touch control points accordingly.

As shown in FIG. 5A, the keypad device further includes a flexible dome structure 514 under the cover 515 of each of the push buttons. The base 513 of the flexible dome structure 515 is fixed onto the substrate 5 where the sensing electrode 51 is formed while separating from the sensing electrode 51. The flexible dome structure 514 is made of a conductive material and deformable so as to be movable toward the central member 512 in response to a pressing operation of a user on the cover 515. In this embodiment, since the outer ring member 511 and the central member 515 are connected to each other on the opposite surface of the substrate 5, no bridge member is needed, and no slit needs to be formed in the flexible dome structure 514. Once the conductive dome structure 514 is pressed to move toward the central member 512 to have a capacitance therebetween increased to a certain extent, a capacitance change between the grounding line (not shown) and the signal line 510 would be detected so that the input or command associated with the push button would be entered.

Figure 6A:
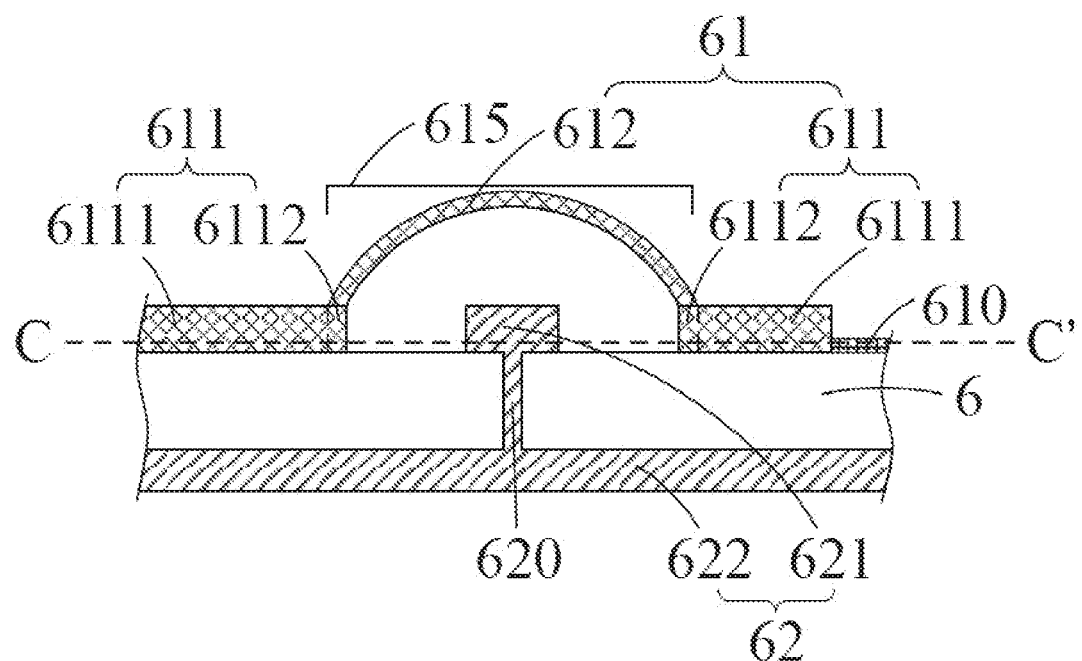
FIG. 6A is a schematic vertically cross-sectional view illustrating a third exemplified structure of a sensing electrode according to the present invention.
Figure 6B:
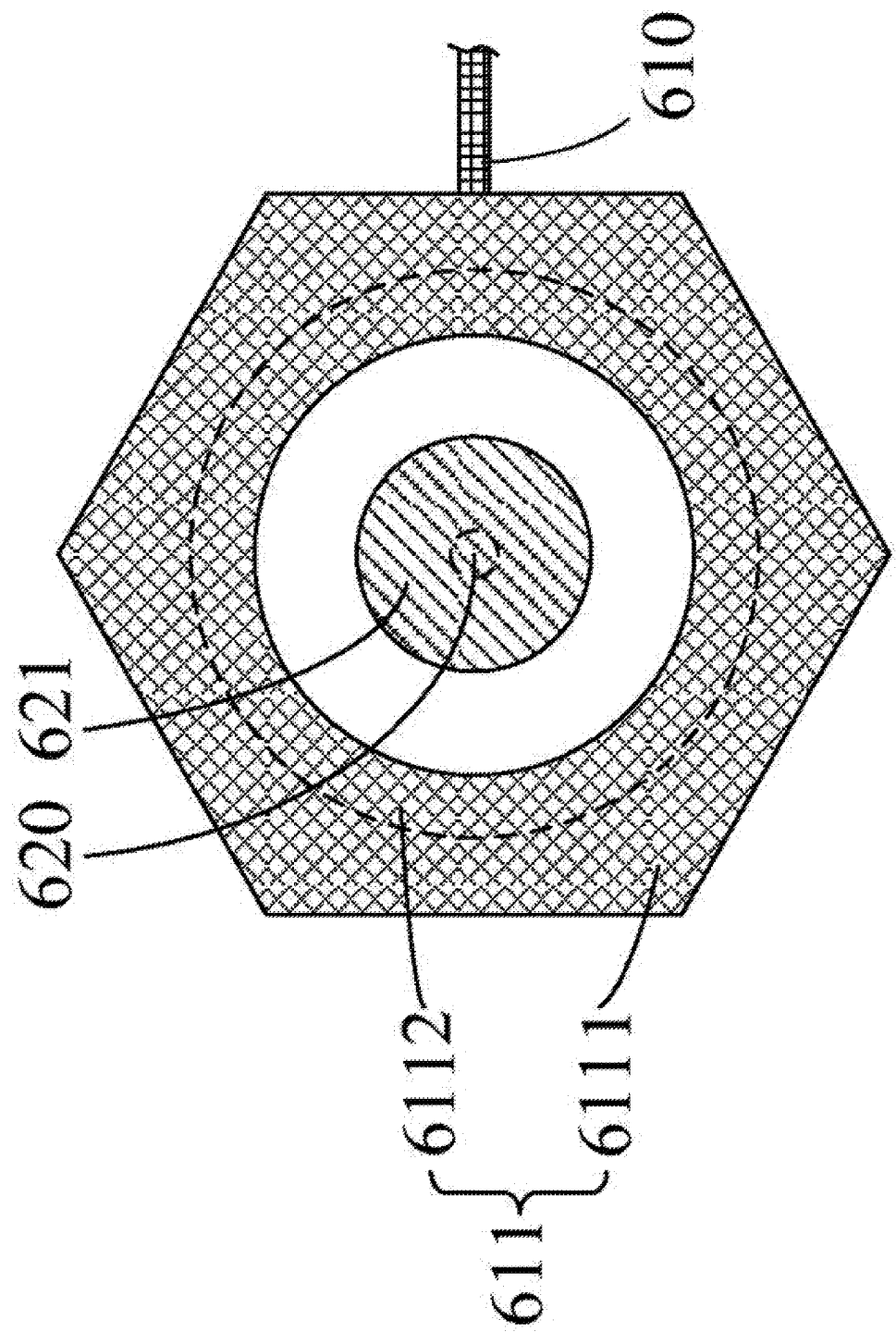
FIG. 6B is a schematic horizontally cross-sectional view of the third exemplified structure of the sensing electrode, taken along the C-C' of FIG. 6A.

FIGS. 6A and 6B illustrate a third exemplified structure of a sensing electrode according to the present invention, wherein FIG. 6A is a schematic vertically cross-sectional view, and FIG. 6B is a schematic horizontally cross-sectional view taken along the C-C' of FIG. 6A. In this embodiment, a sensing electrode 61 and a first common electrode 621 are separately formed on a first surface of a substrate 6, and a second common electrode 622 is formed on a second surface of the substrate 6 opposite to the first surface and electrically coupled to the first common electrode 621 via a through hole 620 between the first and second surfaces. The sensing electrode 61 includes an outer ring member 611 and a flexible dome member 612. The outer ring member 611 includes a first part 6111 covered by, e.g. coated with, an insulating paint layer, and a second part 6112 uncovered by the insulating paint layer. The flexible dome member 612 is made of a conductive material and connected to the second part 6112 of the outer ring member 611. Under the flexible dome member 612 and the second part 6112 of the outer ring member 611 is an inner space where the first common electrode 621 is disposed. The sensing electrode 61 detects the capacitance changes according to the gesture or gesture change of the touching or approaching finger(s), and the sensing circuit estimates the touch control point(s) or the movement of the touch control points accordingly.

The flexible dome member 612 is deformable so as to be movable toward the common electrode 62 consisting of the first common electrode 621 and the second common electrode 622 in response to a pressing operation of a user on the cover 615. Once the conductive dome member 612 is pressed to move toward the common electrode 62 to have a capacitance therebetween increased to a certain extent, or saturated, a capacitance change between the common electrode 62 and the signal line 610 extending from the sensing electrode 61 would be detected so that the input or command associated with the push button would be entered. In other words, the flexible dome member 612 does not only serve as a part of the sensing electrode for touch sensing, but also functions for activation of the associated push button. The touch control device and the keypad device are integrated not only in structure but also in circuitry. Furthermore, a driving voltage can be applied to the common electrode 62 to enhance sensitivity, thereby enlarging the effective sensing distance.

Figure 7A:
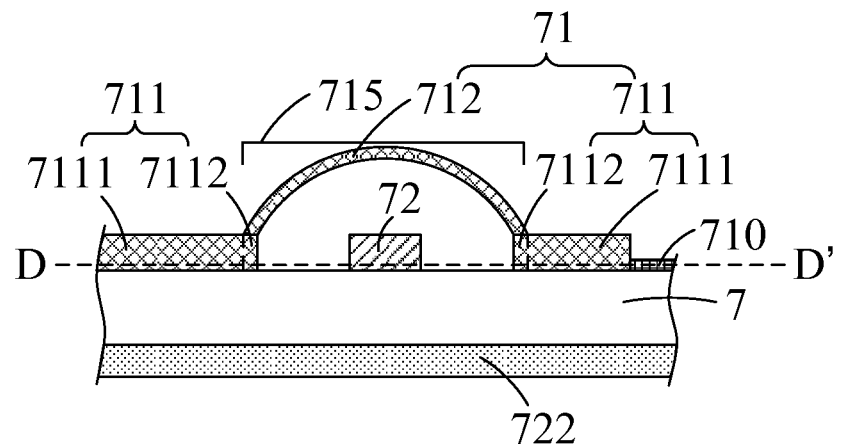
FIG. 7A is a schematic vertically cross-sectional view illustrating a fourth exemplified structure of a sensing electrode according to the present invention.
Figure 7B:
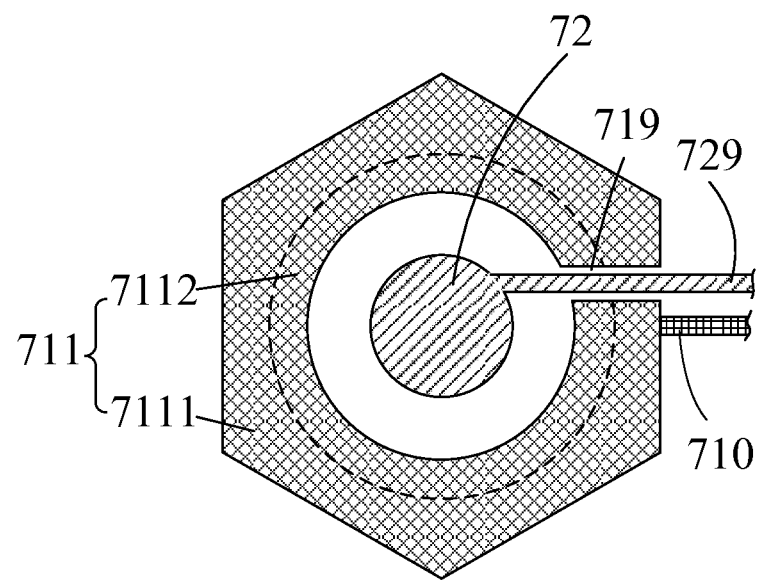
FIG. 7B is a schematic horizontally cross-sectional view of the fourth exemplified structure of the sensing electrode, taken along the D-D' of FIG. 7A.

FIGS. 7A and 7B illustrate a fourth exemplified structure of a sensing electrode according to the present invention, wherein FIG. 7A is a schematic vertically cross-sectional view, and FIG. 7B is a schematic horizontally cross-sectional view taken along the D-D' of FIG. 7A. The sensing electrode 71 in this embodiment is similar to that shown in FIGS. 6A and 6B, which includes an outer ring member 711 and a flexible dome member 712 formed on a substrate 7. The outer ring member 711 includes a first part 7111 covered by, e.g. coated with, an insulating paint layer, and a second part 7112 uncovered by the insulating paint layer. The flexible dome member 712 is made of a conductive material and connected to the second part 7112 of the outer ring member 711. Under the flexible dome member 712 and the second part 7112 of the outer ring member 711 is an inner space where a common electrode 72 is disposed. The common electrode 72 is formed on the substrate 7 and separate from the sensing electrode 71. In this embodiment, a conductive line 729 extending from the common electrode 72 and out of an opening 719 of the outer ring member 711 is electrically connected to other common electrodes. Once the conductive dome member 712 is pressed to move toward the common electrode 72 to have a capacitance therebetween increased to a certain extent, or saturated, a capacitance change between the common electrode 72 and the signal line 710 extending from the sensing electrode 71 would be detected so that the input or command associated with the push button would be entered. In other words, the flexible dome member 712 does not only serve as a part of the sensing electrode for touch sensing, but also functions for activation of the associated push button. The touch control device and the keypad device are integrated not only in structure but also in circuitry. The sensing electrode 71 detects the capacitance changes according to the gesture or gesture change of the touching or approaching finger(s), and the sensing circuit estimates the touch control point(s) or the movement of the touch control points accordingly.

The structure of the flexible dome member 712 may be similar to that exemplified in FIG. 4, and the slit of the flexible dome member 712 is disposed corresponding to the opening 719. Optionally but preferably, an insulating protective layer may be provided over the opening 719, and an electrode layer 722 may be provided on the opposite surface of the substrate 7 for shielding the touch sensing unit from undesirable interference.

Figure 8A:
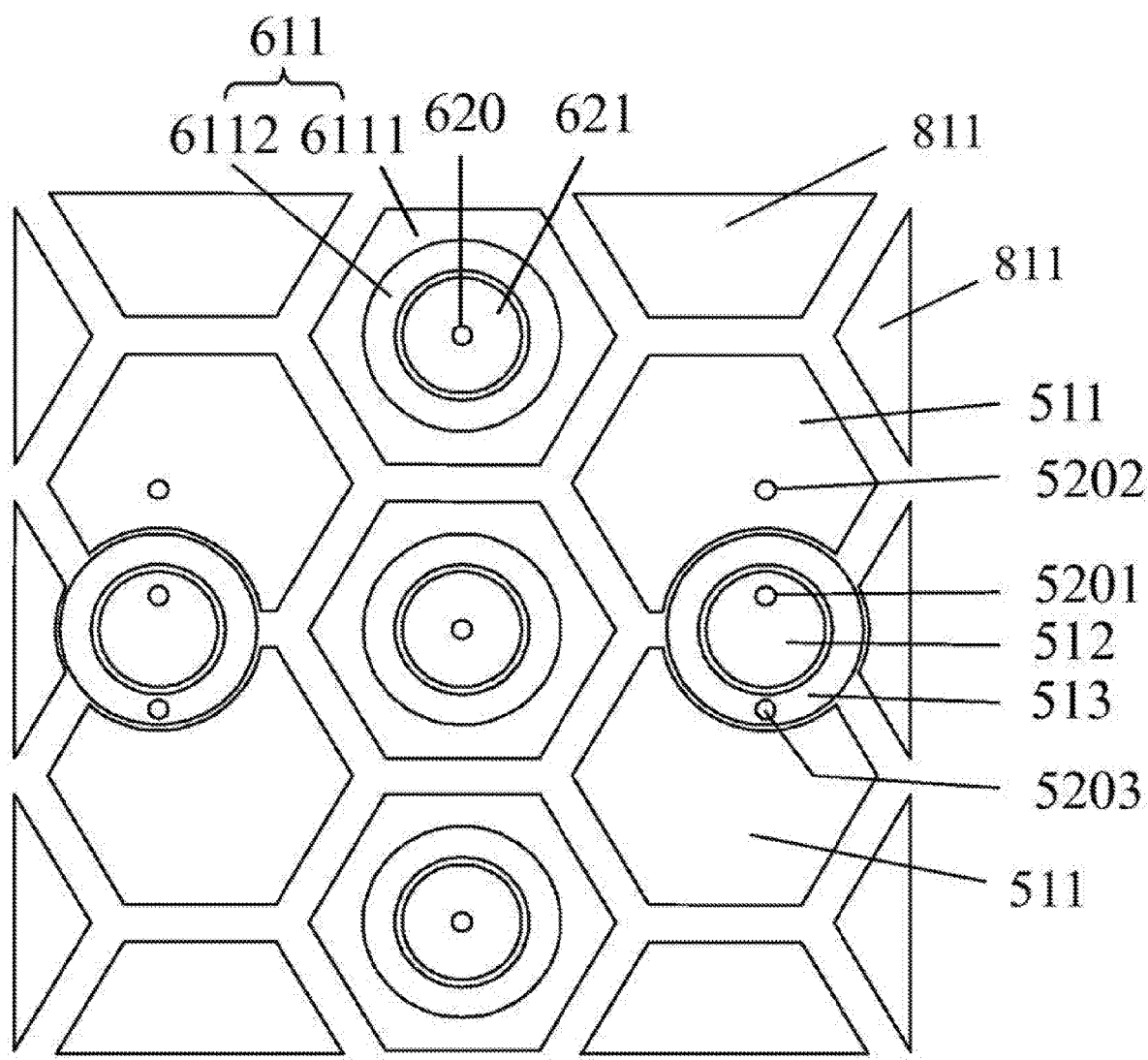
FIG. 8A is a schematic diagram partially illustrating an example of an integrated configuration of sensing electrodes of the touch control device and push buttons of the keypad device, formed on a first surface of a substrate according to an embodiment of the present invention.
Figure 8B:
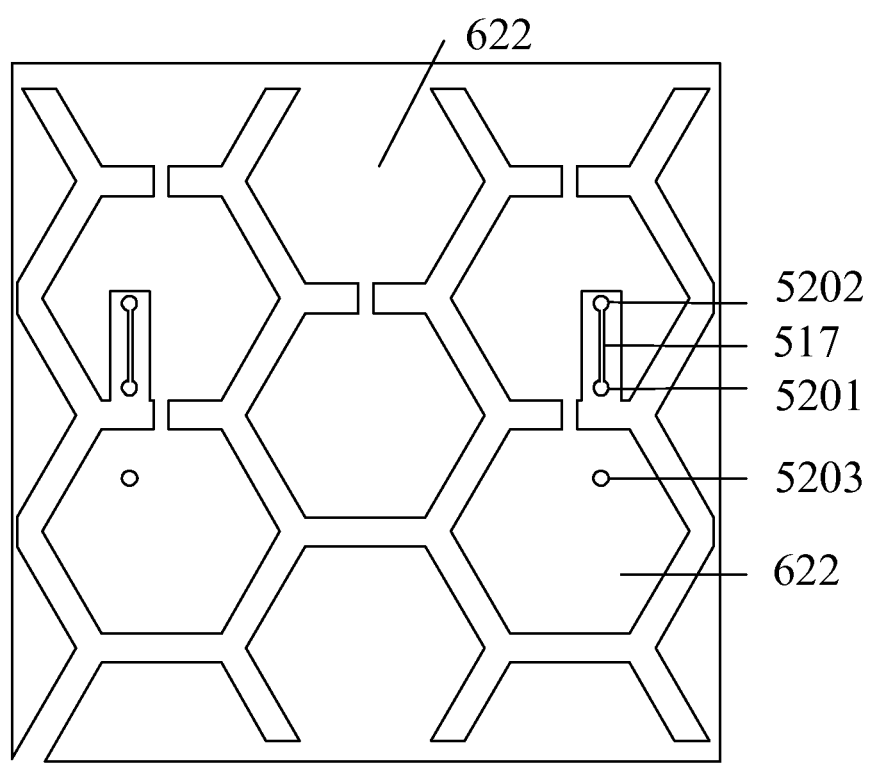
FIG. 8B is a schematic diagram illustrating the example of the integrated configuration shown in FIG. 8A, formed on a second surface of the substrate opposite to the first surface.

FIG. 8A partially illustrates an example of an integrated configuration of sensing electrodes of the touch control device and push buttons of the keypad device, formed on a first surface of a substrate according to an embodiment of the present invention. FIG. 8B illustrates the example of the integrated configuration shown in FIG. 8A, formed on a second surface of the substrate opposite to the first surface. The keypad device in this embodiment includes a five-directional key set similar to the key set consisting of upward, rightward, downward, leftward and enter push buttons as shown in FIG. 1. The integrated configuration of the sensing electrodes of the touch control device and the push buttons of the keypad device conforms to the positions of the five push buttons. In this embodiment, two different integrated structures of touch control device and keypad device are adopted. Furthermore, as shown, a first portion of the sensing electrodes are integrated with the keypad device, e.g. the sensing electrodes including the outer ring members 511 and 611 around the flexible dome structures of the keypad device, and a second portion of the sensing electrodes are independent from the keypad device, e.g. the sensing electrodes 811.

The three units in a column in the middle part of FIGS. 8A and 8B are similar to the integrated structure shown in FIGS. 6A and 6B, while the two units disposed beside the column are similar to the integrated structure shown in FIGS. 5A and 5B. On the first surface of the substrate shown in FIG. 8A, the outer ring member 611 including the first part covered by an insulating paint layer and the second part 6112 uncovered by the insulating paint layer, the first common electrode 621 separate from the outer ring member 611, and the through hole 620 between the first and second surfaces for connecting the first common electrode 621 to the second common electrode 622 disposed on the second surface of the substrate are shown. In addition, the outer ring member 511, the central member 512, the through holes 5202, 5201 for connecting the outer ring member 511 and the central member 512 on the second surface of the substrate as the bridge member 517, the base 513 of the flexible dome structure 514, and the through hole 5203 for connecting the base 513 of the flexible dome structure 514 to the common electrode 622 disposed on the second surface of the substrate are shown. On the second surface of the substrate shown in FIG. 8B, the outer ring member 511 and the central member 512 are connected to each other as the bridge member 517 through the through holes 5202, 5201. By adopting proper structures, the touch-sensitive keypad control device is capable of functioning normally no matter if the push buttons are aligned with or stagger from the sensing electrodes.

Figure 9A:
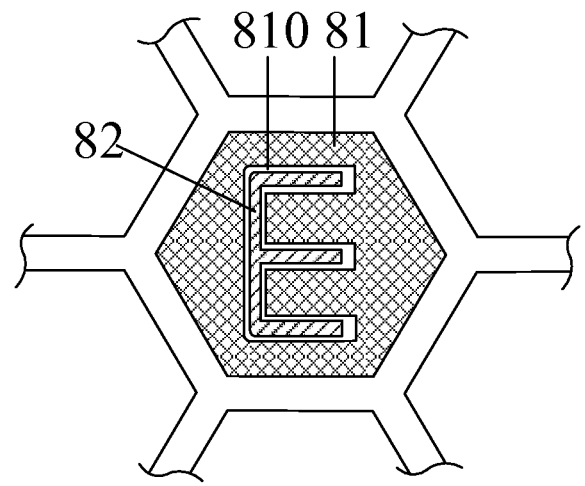
FIG. 9A is a schematic horizontally cross-sectional view illustrating a fifth exemplified structure of a sensing electrode of a touch control device according to the present invention.
Figure 9B:
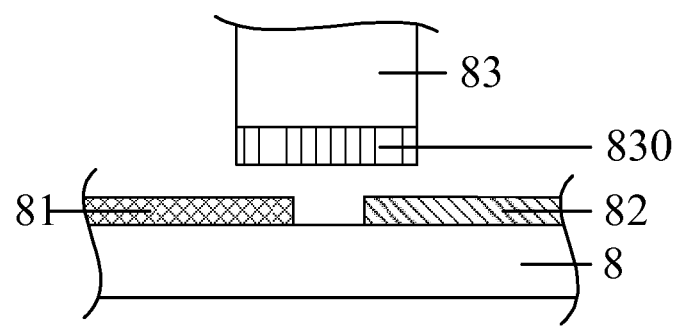
FIG. 9B is a schematic vertically cross-sectional view illustrating an exemplified structure of a push button of a keypad device used with the sensing electrode shown FIG. 9A.
Figure 9C:
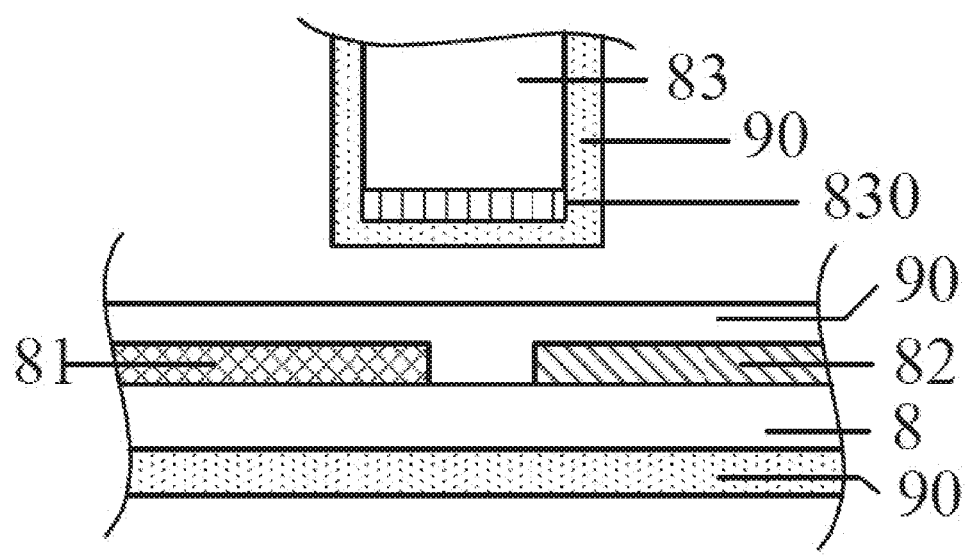
FIG. 9C is a schematic vertically cross-sectional view illustrating another exemplified structure of a push button of a keypad device used with the sensing electrode shown FIG. 9A.

FIG. 9A is a schematic horizontally cross-sectional view illustrating a fifth exemplified structure of a sensing electrode of a touch control device according to the present invention. FIG. 9B is a schematic vertically cross-sectional view illustrating an exemplified structure of a push button of a keypad device used with the sensing electrode shown FIG. 9A. In this embodiment, sensing electrodes 81 on a substrate 8 has a hollow region 810, in which a common electrode 82 is disposed. The common electrode 82 may be electrically connected to other common electrodes via through holes or openings and suitable wires (not shown). A coupling capacitance would be generated between the sensing electrode 81 and the common electrode 82. A base 830 of an elastic key structure 83 is made of a conductive rubber which can be electrically responsive to the common electrode 82. When the elastic key structure 83 is pressed down, the distance between the bottom 830 of the elastic key structure 83 and the sensing electrodes 81 and common electrode 82 would be shortened, or even they finally contact with each other, so that the coupling capacitance value between the sensing electrodes 81 and common electrode 82 are changed, or short-circuit might occur. Since the capacitance increases with the decreasing distance and saturation might occur, the capacitance change between the sensing electrodes 81 and common electrode 82 is detectable. Accordingly, an external sensing circuit can determine whether a corresponding switch is pressed according to the sensing result. If the detected capacitance is greater than a threshold or reaches a saturation level, it is determined that the corresponding key is pressed. Basically, the sensing electrodes 81 are hexagonal and arranged like a honeycomb. The sensing electrode 81 detects the capacitance changes according to the gesture or gesture change of the touching or approaching finger(s), and the sensing circuit estimates the touch control point(s) or the movement of the touch control points accordingly. Furthermore, similar to the integrated configuration shown in FIGS. 8A and 8B, the structure as illustrated in FIGS. 9A and 9B may also support the design of the push buttons, and have the hollow region 810 either aligned with or staggering from the sensing electrodes. For waterproof purpose, the touch control device may further include a waterproof insulating layer 90 overlying the one-dimensional touch sensing unit, as shown in FIG. 9C.

Figure 10:
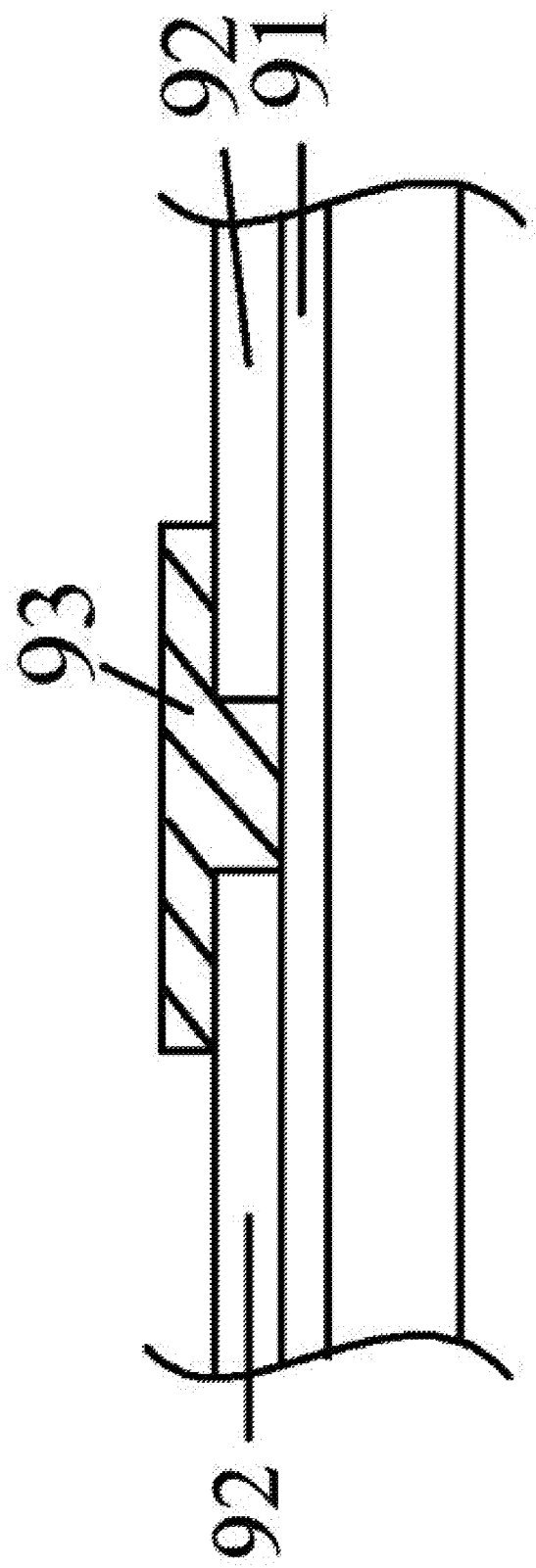
FIG. 10 is a schematic vertically cross-sectional view partially illustrating another example of an integrated configuration of the touch control device and the keypad device according to an embodiment of the present invention.

Sometimes for specific applications, a rigid substrate such as ceramic plate or a curved substrate might be used as the substrate on which the sensing electrodes and keypad device elements are formed. However, problems would be encountered when a ceramic plate or a curved substrate is used as the substrate because it is hard to deal with the surfaces and create the through holes. For solving the problem, a copper foil layer 91, an insulating paint layer 92 and a carbon film 93 are sequential formed on a rigid substrate 9, for example on the top surface, as schematically illustrated in FIG. 10. The copper foil layer 91 can be used to define a desired electrode layout which is supposed to be formed on the bottom surface of the substrate as in the aforementioned embodiments but is actually formed on the top surface of the substrate 9 in this embodiment. The insulating paint layer 92 serves as the substrate on which the sensing electrodes and keypad device elements are formed. The insulating paint layer 92 further functions for insulating the carbon film 93 from the copper foil layer 91, and through hole(s) can be created in the insulating paint layer 92 for connecting the carbon film 93 to the copper foil layer 91. For example, the carbon film 93 is provided to overlie the insulating paint layer 92 by way of printing.

Figure 11A:
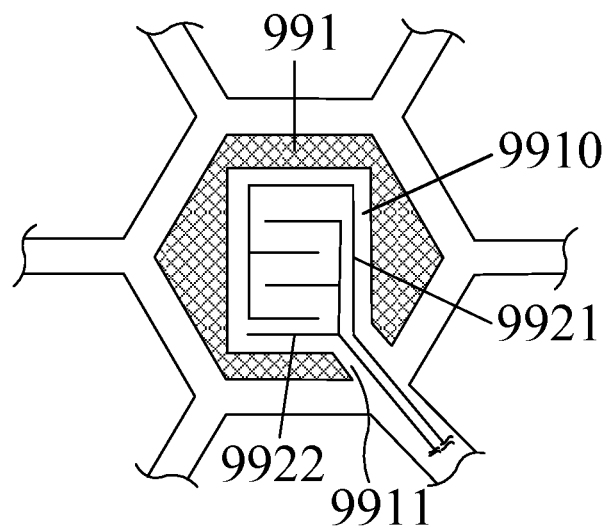
FIG. 11A is a schematic horizontally cross-sectional view illustrating a sixth exemplified structure of a sensing electrode of a touch control device according to the present invention.
Figure 11B:
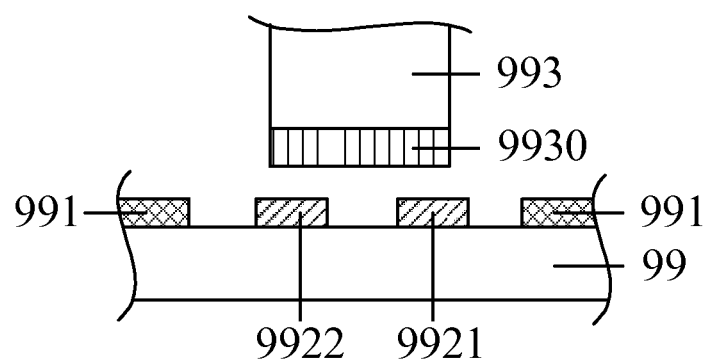
FIG. 11B is a schematic vertically cross-sectional view illustrating an exemplified structure of a push button of a keypad device used with the sensing electrode shown FIG. 11A.

FIG. 11A is a schematic horizontally cross-sectional view illustrating a sixth exemplified structure of a sensing electrode of a touch control device according to the present invention. FIG. 11B is a schematic vertically cross-sectional view illustrating an exemplified structure of a push button of a keypad device used with the sensing electrode shown FIG. 11A. In this embodiment, a resistive type keypad is inserted into a touch sensing unit. A sensing electrode 991 on the substrate 99 has a hollow region 9910 where a first key electrode 9921 and a second key electrode 9922 are formed. The routing layout of the first key electrode 9921 and the second key electrode 9922 can be accomplished via through holes or openings 9911 of the sensing electrode 991. A base 9930 of the elastic key structure 993 is made of a conductive rubber. When the elastic key structure 993 is pressed down until the base 9930 of the elastic key structure 993 is in contact with the first key electrode 9921 and the second key electrode 9922 so as to electrically conduct the first key electrode 9921 and the second key electrode 9922. The resistance change resulting from the electric conduction of the first key electrode 9921 and the second key electrode 9922 is provided for an external sensing circuit to determine whether a corresponding key is pressed. Basically, the sensing electrodes 991 are hexagonal and arranged like a honeycomb. The sensing electrode 991 detects the capacitance changes according to the gesture or gesture change of the touching or approaching finger(s), and the sensing circuit estimates the touch control point(s) or the movement of the touch control points accordingly.

Figure 12:
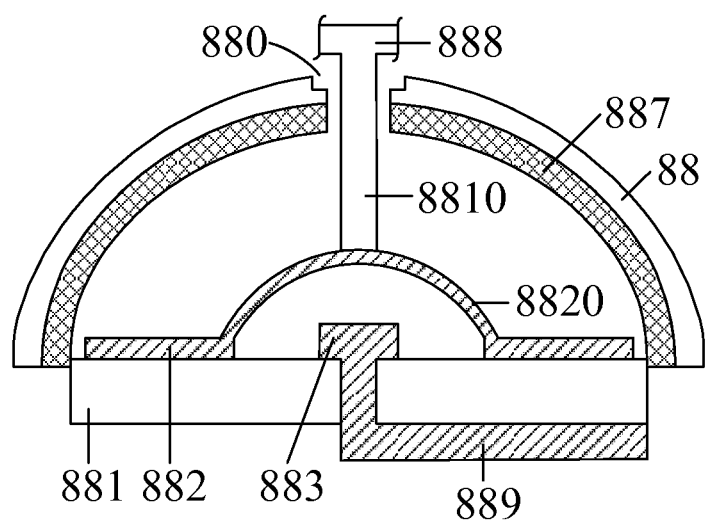
FIG. 12 is a schematic diagram partially illustrating a further example of an integrated configuration of the touch control device and the keypad device according to an embodiment of the present invention.

Refer to FIG. 12, which is a schematic diagram partially illustrating a further example of an integrated configuration of the touch control device and the keypad device according to an embodiment of the present invention. A touch sensing electrode 887 is formed on or under the bottom surface of a substrate 88 while exposing electrode pins (not shown). The touch sensing electrode 887, which can be a one-dimensional touch sensing layer, for example, is used for detecting how the capacitance changes due to the touching or approaching finger(s) (or palm(s) or conductive object(s)). The sensing electrode 887 detects the capacitance changes according to the gesture or gesture change of the touching or approaching finger(s), and the sensing circuit estimates the touch control point(s) or the movement of the touch control points accordingly.

The substrate 88 can be a flat substrate or a semi-spherical substrate as shown. At least one through hole 880 is created in the substrate 88 for penetrating therethrough a physical key cover 888. The bottom of the physical key cover 888 rests on a flexible dome structure 8820 which is formed on a circuit board 881. A common electrode layer 882 and a switch sensing electrode 883 are also formed on the circuit board 881. The common electrode layer 882 is electrically connected to the flexible dome structure 8820 which is made of a conductive material. The common electrode layer 882 and the flexible dome structure 8820, in addition to screening out the interference from the elements under the sensing electrode layer 887, may be applied thereto a driving voltage so as to enhance sensitivities. As a result, a larger sensible distance can be acquired. On the other hand, the switch sensing electrode 883 is electrically connected to an external sensing circuit (not shown) via a conductive line 889. When the flexible dome structure 8820 is pressed so as to be in contact with the switch sensing electrode 883, the external sensing circuit can determine that the corresponding key is pressed accordingly. Furthermore, a driving voltage may be applied to the common electrode layer 882 so as to enhance sensitivities. As a result, a larger sensible distance can be acquired.

The one-dimensional capacitive touch sensing electrode layer 887 may be connected to other signal lines (not shown) on the circuit board 881 with electrode pins extending outside the edge of the substrate while avoiding contact with the common electrode layer 882 and the switch sensing electrode 883. The connection, for example, can be accomplished via a conductive rubber or a thimble. By way of the touch control device including the substrate 88 and the touch sensing electrode layer 887, cursor movement in the user interface can be controlled. The keypad device including the physical key cover 888, the flexible dome structure 8820 and the switch sensing electrode 883 can be used as an enter key, which is one of the five-directional keys.

In view of the foregoing, the present invention provides a number of embodiments of touch-sensitive keypad control devices, which satisfy a variety of requirements for command input. Functions of both keying in and touch sensing to control window-type user interface can be done by the same control device. The electrodes mentioned above can be made of transparent or opaque materials. The electrode patterns can be defined, for example, by way of a photolithographic process, printing, laser etching or electro-plating. The substrate can be a rigid substrate or a soft substrate. The integrated functions of the keypad device and touch control device are applicable to corded or cordless remote controllers or keyboards or any other suitable keypad devices. Since the touch-sensitive keypad control device according to the present invention is capable of detecting air gestures, it is advantageous to be used as the keypad device of medical equipment.

In summary, the embodiments of the invention provide a method and device for sensing a control point, which are applied to a sensing panel. Position information of a control point can be accurately sensed by the method and device without increasing the number of signal lines. While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A touch-sensitive keypad control device for use with a controlled device, comprising:
    a housing;
    a touch control device including a one-dimensional touch sensing unit formed with a plurality of separate sensing electrodes on a substrate accommodated in the housing, wherein at least one of the sensing electrodes includes an outer ring member, and a central member surrounded by the outer ring member; and
    a keypad device integrated with a first portion of the sensing electrodes and independent from a second portion of the sensing electrodes, wherein the keypad device is uncovered from the housing to be pressed by a user, and includes at least one cover and a flexible dome member which is deformable so as to be movable toward the central member in response to a pressing operation of a user on the cover, and when pressed, the flexible dome member moves toward the substrate to have a level change relative to the first portion of the sensing electrodes;
    wherein the flexible dome member is electrically coupled to the outer ring member; a first touch sensing command is generated for controlling the controlled device in response to a first gesture of a user over the first portion of the sensing electrodes, a second touch sensing command is generated for controlling the controlled device in response to a second gesture of a user over the second portion of the sensing electrodes, and a key input command is generated for controlling the controlled device in response to the movement of the keypad device enabled by a user relative to the first portion of the sensing electrodes, and at least one of the first portion of the sensing electrodes includes the outer ring member, the central member surrounded by the outer ring member and covered by the keypad device, and a bridge member being the only connection between the outer ring member and the central member.

2. The touch-sensitive keypad control device according to claim 1, being a remote controller, wherein the keypad device includes a plurality of push buttons each independently movable to trigger the generation of the key input command in response to a pressing operation of a user.

3. The touch-sensitive keypad control device according to claim 1, wherein the first gesture is a sliding operation on or over the first portion of the sensing electrodes, and the second gesture is a sliding operation on or over the second portion of the sensing electrodes.

4. The touch-sensitive keypad control device according to claim 1, wherein the movement of the keypad device enabled by a user relative to the first portion of the sensing electrodes is a vertical movement within a specified range or a holding-still action for a specified duration above the keypad device, and the first gesture is a sliding operation on or over the keypad device.

5. The touch-sensitive keypad control device according to claim 1, wherein the sensing electrodes and a first common electrode are separately formed on a first surface of the substrate, and a second common electrode is formed on a second surface of the substrate opposite to the first surface and electrically coupled to the first common electrode via a through hole between the first and second surfaces, wherein the outer ring member has a first part covered by an insulating paint layer, a second part uncovered by the insulating paint layer and an inner space where the first common electrode is disposed.

6. The touch-sensitive keypad control device according to claim 5, wherein at least one cover overlies the flexible dome member, and the flexible dome member is deformable so as to be movable toward the first common electrode in response to the pressing operation of the user on the cover.

7. The touch-sensitive keypad control device according to claim 1, wherein the touch control device further includes a waterproof insulating layer overlying the one-dimensional touch sensing unit.

8. A remote controller, comprising:
    a housing;
    a touch control device including a one-dimensional touch sensing unit formed with a plurality of separate sensing electrodes on a substrate accommodated in the housing, wherein at least one of the sensing electrodes includes an outer ring member, a central member surrounded by the outer ring, and a bridge member being the only connection between the outer ring member and the central member; and
    a keypad device uncovered from the housing to be pressed by a user, and when pressed, moving toward the substrate to have a level change relative to the substrate;
    wherein the keypad device includes a cover and a flexible dome member covered by the cover and disposed between the cover and the substrate, and
    wherein the sensing electrodes and a first common electrode are separately formed on a first surface of the substrate, and a second common electrode is formed on a second surface of the substrate opposite to the first surface and electrically coupled to the first common electrode via a through hole between the first and second surfaces, wherein the outer ring member includes a first part covered by an insulating paint layer, a second part uncovered by the insulating paint layer and an inner space where the first common electrode is disposed, and the flexible dome member is electrically coupled to the second part of the outer ring member, and wherein a movement of the flexible dome member of the keypad device enabled by a user toward the central member renders a key input action, and a gesture of a user over the sensing electrodes covered by the cover but uncovered from the flexible dome member renders a touch sensing action.

\* \* \* \* \*